United States Patent [19]

Divin

[11] Patent Number: 5,123,733
[45] Date of Patent: Jun. 23, 1992

[54] METHOD FOR MEASURING THE SPATIAL DISTRIBUTION OF ELECTROMAGNETIC RADIATION INTENSITY

[75] Inventor: Jury Y. Divin, Moscow, U.S.S.R.

[73] Assignee: Institut Radiotekhniki I Elektroniki Akademiinauk SSSR, Moscow, U.S.S.R.

[21] Appl. No.: 460,348

[22] PCT Filed: Aug. 30, 1988

[86] PCT No.: PCT/SU88/00174

§ 371 Date: May 10, 1990

§ 102(e) Date: May 10, 1990

[87] PCT Pub. No.: WO90/02420

PCT Pub. Date: Mar. 8, 1990

[51] Int. Cl.⁵ ............................................. G01J 1/00
[52] U.S. Cl. ................................. 356/121; 250/336.2; 357/5
[58] Field of Search ............... 356/121; 250/336.2; 357/5

[56] References Cited

U.S. PATENT DOCUMENTS 3,760,181 9/1981 Daly et al.
4,287,418 9/1981 Divin et al.
4,613,880 9/1986 Kuwano et al. ............... 357/5

FOREIGN PATENT DOCUMENTS 1488258 10/1977 United Kingdom.

OTHER PUBLICATIONS

Zappe, H. H., "High–Gain Josephson Device" *IBM Technical Disclosure Bulletin* vol. 15, No. 1, Jun. 1972, pp. 241–242.
Dzh. Lloid "Systemy Teplovidenia", 1978, Radioelecktronika Za Rubezhom. Obzory, 5, 1985.
"Mozaihnye Ik-Datchike", pp. 2, 6, 10 (Jan. 1985).
Physical Review B, vol. 31, No. 9, "Nonlocal Response of Josephson Tunnel Junctions to a Focused Laser Beam"(1 May 1985).
Applied Physics Letters, 1985, vol. 46, No. 1.
Josephson Effect Fizika I Primenenie, Moscow "MIR" 1984.
Multipleksnye Systemy Izmerenii V Fizike, L. M. Soroko (no date).
Self–Contained Automatic Recorder of the DC Josephson Current Rev. Sci. Instrum. 49(12) Dec. 1978, pp. 1732–1734.
Physical Review B, vol. 3, No. 9 "Super-Current Density Distribution in Josephson Junctions"(1 May 1971).
Inverse Source Problems in Optics "Obratnye Zadachi V. Optike"(no date).
Journal of the Optical Society of Amerika, vol. 65, No. 6, "Spatialy Multiplexed Infrared Camera"(Jun. 1975).

*Primary Examiner*—Richard A. Rosenberger
*Attorney, Agent, or Firm*—Ladas & Parry

[57] ABSTRACT

The measurement method according to the invention comprises coding conversion of the spatial intensity distribution of electromagnetic radiation into an electric signal with the aid of the stationary Josephson effect, setting this signal to be variations in the maximal Josephson current produced by the electromagnetic radiation under study, varying the coding conversion parameters by applying an external magnetic field to junction (2), with spatial frequencies of the Josephson current density as a function of Josephson junction (2) coordinates serving as these coding conversion parameters, measuring the electric signal as a function of these coding conversion parameters, and decoding injective mapping of the measured dependence of electric signal from the coding conversion parameters with the aid of the integral Fourier transform.

6 Claims, 3 Drawing Sheets

METHOD FOR MEASURING THE SPATIAL DISTRIBUTION OF ELECTROMAGNETIC RADIATION INTENSITY

FIELD OF THE INVENTION

The invention relates to the area of measurement of the major characteristics of electromagnetic radiation, and more specifically to a method for measuring the spatial distribution of electromagnetic radiation intensity.

PRIOR ART

Known in the art is a method for measuring the spatial distribution of electromagnetic radiation intensity (J. M. Lloyd Thermal Imaging Systems, 1978, Moscow, Mir, (in Russian)), wherein a fragment of the spatial distribution of electromagnetic radiation intensity is directed to a receiver of electromagnetic radiation, with subsequent scanning, i.e. successive variation in time of the receiver position $(x_n(t), y_n(t))$ relative to the distribution $W(x,y)$ under sturdy, and the receiver's electric signal $\Delta I$ is measured as a function of its position $(x_n(t), y_n(t))$, with this signal's time dependence $I(t)$ processed to improve the signal/noise ratio and contrast, and finally the time dependence $\Delta I(x_n(t), y_n(t))$ is transformed into a stationary optical image.

The necessity of successive scanning, usually performed with the aid of optico-mechanical devices, complicates these measurements and causes an inadequate sensitivity and resolution of this method.

Also known in the art is a method for measuring the spatial distribution of electromagnetic radiation intensity (J. M. Lloyd Thermal Imaging Systems, 19878, Moscow, Mir, (in Russian)) Radioelektronika za rubezhom, issue 5, 1985, L. F. Burlak, "Mozaichnie infrakrasnie datchiki" ("Mosaic IR sensors"), p. 2.—In Russian), differing from the preceeding one by the use of arrays of N receiver elements, both linear and two-dimensional, and continuous structures of the SPRITE type (GB, B, 148258; Radiotekhnika za rubezhom, issue 5, 1985, L. F. Burlak, "Mozaichnie infrakrasnie datchiki" ("Mosaic IR sensors"), p. 6.—In Russian).

This method provides for a $N^{\frac{1}{2}}$ times improvement of the signal/noise ratio. However, this method also uses scanning, this, along with the difficulty of simultaneously recording and processing N time dependencies of $\Delta I_n(t)$ electric signals, substantially complicates the method. Furthermore, in a method using multielement arrays of receivers it is impossible to ensure high spatial resolution due to crosstalk interference between array elements.

Also known in the art is a method for measuring spatial intensity distributions (D. W. Davies "Spatially multiplexed infrared cameras", J. Opt. Soc. Am., vol. 65, No. 6, pp. 707–711), wherein the spatial distribution of electromagnetic radiation is code converted into an electric signal with the aid of a set of orthogonal optical transmitting masks and a radiation receiver, coding conversion is varied by replacing one coding mask with another, the dependence of the electric signal on the coding conversion parameters is measured by recording the electric signal $\Delta I_i$ at the output of the receiver for each $i=$th coding masks, after which injective decoding mapping of the measured dependence of the electric signal from the parameters of the coding conversion is performed on a computer.

Optical coding as the first step of coding conversion is usually carried out with the aid of mechanically shifted optical masks, so that resolution in this method is determined by the size of the least element in the coding mask. Engineering difficulties limit the smallest size attainable of smallest mask elements, while the accuracy of their fabrication determines not only the resolution, but also the accuracy of spatial distribution measurements (L. N. Soroko, "Multiplexnie systemi izmerenij v fizike" ("Multiplexed measurement systems in physics"), Moscow, Atomizdat, 1980, pp. 31-32.—In Russian). Moreover, smaller element size in coding masks impairs the efficiency of optical coding due to radiation diffraction at the small-size elements of coding masks, this restricting expanding the use of this method to the longer infrared range, where the wavelength approaches the minimal size $d_{min}$ of the coding mask element. Thus, optical coding substantially complicates the measurement technique, is the reason of its moderate spatial resolution and does not allow expansion into the long-wave range.

DISCLOSURE OF THE INVENTION

This invention is to provide a method for measuring the spatial distribution of electromagnetic radiation, using such a coding conversion of the spatial distribution of electromagnetic radiation intensity into an electric signal with the aid of photoelectric effects in superconducting structures submitted to the action of a magnetic field and such a decoding injection mapping of the measured dependence of the electric signal from the coding conversion parameters, which would allow simplification of measurements and improvement of the spatial resolution.

This is accomplished by that in the method for measuring the spatial distribution of electromagnetic radiation intensity, comprising coding conversion of the spatial distribution of electromagnetic radiation intensity into an electric signal, varying the parameters of the coding conversion, measurement of the dependence of the electric signal from the coding conversion parameters, and decoding injective mapping of the measured dependence of the electric signal from the coding conversion parameters, according to this invention, the coding conversion version of the spatial distribution of electromagnetic radiation intensity into an electric signal is accomplished with the aid of the stationary Josephson effect, directing the electromagnetic radiation directly at a Josephson junction having a length and width not exceeding the depth of magnetic field penetration into the junction comprising two superconducting electrodes with a positioned between them barrier, defining as the electric signal variations of the maximal Josephson current through the Josephson junction under the effect of the electromagnetic radiation, with spatial frequencies of the dependence of Josephson current density from the coordinates in the plane of the Josephson junction used as the parameters of the coding conversion, varying these spatial frequencies in the range from zero to a value reciprocal to spatial resolution by applying an external magnetic field to the Josephson junction, and using Fourier's integral transformation for decoding injective mapping of the dependence of variations of the maximal Josephson current through the Josephson junction under the action of electromagnetic radiation from the spatial frequencies.

It is expedient, that in the method for measuring spatial distributions of electromagnetic radiation intensity, at an arbitrary distribution of the electromagnetic intensity in space, this radiation be directed at part of the surface of a Josephson junction barrier.

It is useful, that in the method for measuring spatial distributions of electromagnetic radiation intensity, at an arbitrary spatial distribution of the electromagnetic radiation intensity, this radiation be directed at a part of the surface of one of the superconducting electrodes of a Josephson junction.

It is advantageous, that in the method for measuring the spatial distribution of electromagnetic radiation intensity, at an even parity of the spatial distribution of electromagnetic radiation intensity, this radiation be directed to the entire surface of a Josephson junction barrier.

It is profitable, that in the method for measuring spatial distributions of electromagnetic radiation intensity, at an even parity of the spatial distribution of electromagnetic radiation intensity, this radiation be directed to the entire surface of one of the superconducting electrodes of a Josephson junction.

It is also expedient, that in the method for measuring the spatial distribution of electromagnetic radiation intensity the Josephson junction used be a Josephson junction with a uniform distribution of the maximum Josephson current density in the absence of an external magnetic field.

The method for measuring the spatial distribution of electromagnetic radiation intensity of this invention allows the measurement techniques to be simplified, the spatial resolution to be improved, and also expands its applicability into the range of longer wavelengths.

BRIEF DESCRIPTION OF THE ACCOMPANYING DRAWINGS

In the following the invention will be described in greater detail with reference to specific embodiments thereof and to the accompanying drawings, wherein.

Figure 3:
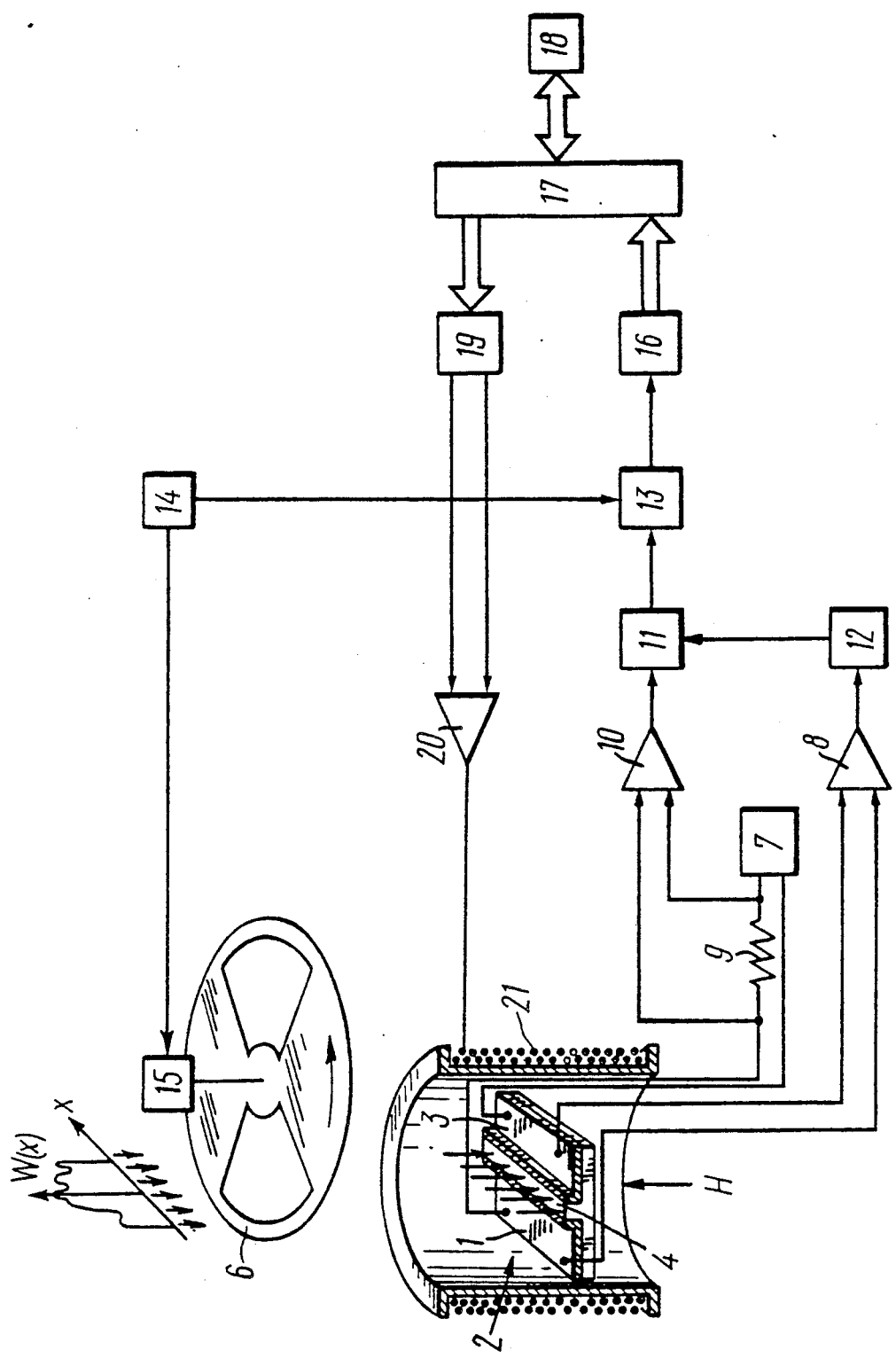

FIG. 3 schematically shows the functional diagram of a system using the method for melasuring the spatial distribution of electromagnetic radiation intensity, according to the invention.

PREFERRED EMBODIMENT OF THE INVENTION

The method for measuring the spatial distribution of electromagnetic radiation intensity of this invention is based on the interaction of the spatial distribution of electromagnetic radiation intensity with a spatial periodic distribution of currents induced in Josephson junctions under the action of an applied magnetic field.

This interaction can take place in two configurations. Firstly, with the radiation with a $W(x,y)$ intensity distribution is directed at one electrode of a Josephson junction, in which case the radiation with frequencies $\nu > 2\Delta/h$, where $2\Delta$ is the energy gap of the superconducting film electrode and h is Planck's constant, produces breakups of Cooper pairs and generation of nonequilibrium quasi-particles. If the quasi-particle diffusion length $L_D$ is shorter than the characteristic lengths $\Delta L$ of $W(x,y)$ variations, the distribution of nonequilibrium quasi-particle density $n(x,y)$ will be directly proportional to the radiation intensity distribution $W(x,y)$. This is valid for the case of low intensities W. Generation of nonequilibrium quasi-particles causes variation of the spatial distribution of the energy gap $\Delta(x,y)$ in the electrode, this leading to corresponding variations in the critical Josepson current density, $\Delta j_c(x,y)$ (A. Barone, G. Paterna Physics and Applications p.68, 96–98 of Josephson Effect 1984, Mir, Moscow.)

Characteristic lengths of $\Delta(x,y)$ and $\Delta j_c(x,y)$ variations are substantially shorter than the diffusion length $L_D$ and therefore variations in the critical Josephson current density $\Delta j_c(x,y)$ will be directly proportional to $W(x,y)$ if $L_D < \Delta L$. The radiation may also cause variations of junction electrode temperature $\delta T(x,y)$ with corresponding variations in the critical Josephson current density, $\Delta j_o(x,y) \sim \delta T(x,y) \sim W(x,y)$. Variations $\Delta j_o(x,y)$ here will be proportional to $W(x,y)$ if the characteristic thermal conductivity length $\eta$ in the film is shorter than the characteristics lengths $\Delta L$ of $W(x,y)$ variation.

In the second plane, the radiation with an $W(x,y)$ distribution can be directed to the junction barrier, such a possibility being realized with the aid of junctions with a photosensitive barrier. In this case variations $\Delta j_o(x,y)$ will be proportional to $W(x,y)$ if the characteristic dimension of barrier inhomogneities caused by irradiation will not exceed the characteristic lengths of intensity $W(x,y)$ variations.

Consequently, in the cases cited herein above and with the conditions herein above stated satisfied, the spatial distribution of intensity $W(x,y)$ may be translated into variations of the spatial distribution of Josephson junction critical current density, $\Delta j_o(x,y)$, so that $\Delta j_o(x,y) \sim W(x,y)$. Irradiation of the junction may also cause changes in the spatial distribution of the constant phase shift, $\Delta \phi(x,y)$, although, as demonstrated by Y. Y. Chang, C. H. Ho, D. Y. Scalapino in "Non-local response of Josephson tunnel junctions to a focused laser beam" (Phys. $R_e$v., B, vol. 31 No. 9 (1985), pp. 5826–5836), such non-local effects in junctions with dimensions $L < \lambda_J$, where $\lambda_J$ is the Josephson depth of magnetic field penetration into the junction, at $\Delta j_c << j_{co}$, are negligible.

Mathematical substantiation of the method of this invention shall be based on the well-known relation of the maximum current $I_c$ of a Josephson junction in a magnetic field $\vec{H} = i\vec{H}_x + j\vec{H}_y$. In case of a rectangular junction $$\left( -\frac{W}{2} \leq y \leq \frac{W}{2}, -\frac{L}{2} \leq x \leq \frac{L}{2} \right); \quad (1)$$

$$J_c(k_x, k_y) = \left| \int_{-W/2}^{W/2} dy \int_{-L/2}^{L/2} dx I_c(x,y) e^{-i2\pi(k_x x + k_y y)} \right|,$$

where: $k_x = -dH_y/\phi_o$; $k_y = dH_x/\phi_o$; where $k_x$ and $k_y$ are spatial frequencies in the dependence of Josephson current density $J_c \exp[-i2\pi(k_x x + k_y y)]$ on the coordinates x, y; $\Phi = 2.07 \cdot 10^{-7}$ Gcm² is the magnetic flux quantum; $d = t + \lambda_{L1} + \lambda_{L2}$ is the depth of magnetic field penetration into a Josephson junction; t is the barrier thickness $\eta_{L1}$ and $\eta_{L2}$ are the London depths of magnetic field penetration into the superconducting electrodes of a Josephson junction.

Relation (1) is valid at $L, W < \lambda_J$. From relation (1) it is evident, that the magnitude of maximal Josephson current $I_c(k_x, k_y)$ is equal to absolute value of a Fourier transform of the spatial distribution of the Josephson critical current density $j_c(x,y)$.

Relation (1) can be used to define the relation between variations of the critical current, $\Delta I_c(k_x, k_y) = I_c(k_x, k_y) - I_{co}(k_x, k_y)$, caused by irradiation and variations of the spatial distribution of the critical current density $$\Delta J_c(x,y) = j_c(x,y) - j_{co}(x,y). \quad (2)$$

At $|\Delta j_c(x,y)| << j_{co}$ and $j_{co}$ = const:

$$\Delta I_c(k_x, k_y) = Re \int_{-W/2}^{W/2} dy \int_{-L/2}^{L/2} dx \Delta j_c(x,y) e^{-i2\pi(k_x x + k_y y)},$$

i.e. the variation of critical current, $\Delta I_c(k_x, k_y)$, is equal to the real part of a Fourier transform of the variation of the spatial distribution of critical current density.

Derivation of equation (2) was simplified by assuming $j_{co}$ = const; however, an equation similar to (2) can be derived for the case $j_{co} \neq$ const as well.

Applying the inverse Fourier transform to equation (2), we obtain:

$$W(x,y) \sim \Delta j_c'(x,y) = \int_{-\infty}^{\infty} \int dk_x dk_y I_c(k_x,k_y) e^{-i2\pi(k_x x + k_y y)}, \quad (3)$$

i.e. applying the Fourier transform to an experimentally measured dependence of critical current variations $\Delta I_c$ as a function of the magnetic field results in the even parity part, $\Delta j_c'$, of the distribution variations of the junction critical current density, i.e. the part featuring the property $\Delta j_c'(-x,-y) = \Delta j_c'(x,y)$. If the electromagnetic radiation features an even parity spatial distribution $W'(x,y)$, as is the case, for instance, for laser beams, resonators and light waveguides, equation (3) describes the sought-for intensity distribution $W(x,y)$. In case of an arbitrary intensity distribution $W(x,y)$ and a correspondingly arbitrary $j_c(x,y)$ distribution the analogy between the method of this invention and the process of optical image generation may be applied, this allowing the use of inverse optical problem solution methods. (B. P. Bolts (Ed.), "Inverse problems in optics", Moscow, Mashinostroenie Publishers, 1984, pp. 28-29. - In Russian) for the case under study. In accordance with the herein above cited, in case of an arbitrary spatial distribution $W(x,y)$ the radiation may be directed to part of the surface of the superconducting electrode or of the barrier. Thus, for instance, the radiation with the sought-for distribution may be directed to only one half of the rectangular electrode ($x \leq 0$) and the arbitrary distribution $\Delta j_c(x,y)$ induced by $W(x,y)$ may then be determined as:

$$W(x,y)\Big|_{x \leq 0} \sim \Delta j_o'(x,y) = \quad (4)$$

$$\int_{-\infty}^{\infty} \int dk_x dk_y \Delta I_c(k_x,k_y) e^{-i2\pi(k_x x + k_y y)}$$

Equation (4) allows an arbitrary sought-for spatial distribution $W(x,y)$ of electromagnetic radiation to be determined from an experimentally measured $\Delta I_c(k_x, k_y)$ dependence.

The method for measuring the spatial distribution of electromagnetic radiation intensity according to this invention comprises coding conversion of the distribution of electromagnetic radiation intensity into an electric signal with the aid of the stationary Josephson effect by directing the electromagnetic radiation directly to a Josephson junction with a length and width not exceeding the Josephson depth of magnetic field penetration into the junction comprising two superconducting electrodes divided by a barrier. The coding conversion parameters are varied; spatial frequencies of the dependence of Josephson current density on the coordinates in the plane of the Josephson junction are the conversion parameters used in this case and varied by applying an external magnetic field to the Josephson junction such, that the spatial frequencies vary from zero to a magnitude equal to the reciprocal of the required spatial resolution. The dependence of the electric signal from the coding conversion parameters is measured, with variations of the maximal Josephson current in the Josephson junction caused by the electromagnetic radiation serving as the electric signal measured. After this decoding injection mapping is performed on the dependence of the maximal Josephson current variations in the Josephson junction caused by the electromagnetic radiation from the spatial frequencies, by applying the Fourier integral transform.

With an arbitrary distribution of the electromagnetic radiation intensity, this radiation is directed at a part of the surface of a Josephson junction barrier or at a part of the surface of one its superconducting electrodes.

With an even parity of the spatial distribution of the electromagnetic radiation intensity, the radiation is to illuminate the entire surface of a Josephson junction barrier or the entire surface of one of its superconducting electrodes.

The Josephson junction used for measurements should feature a uniform distribution of the maximal Josephson current density in the absence of an external magnetic field.

Figure 1:
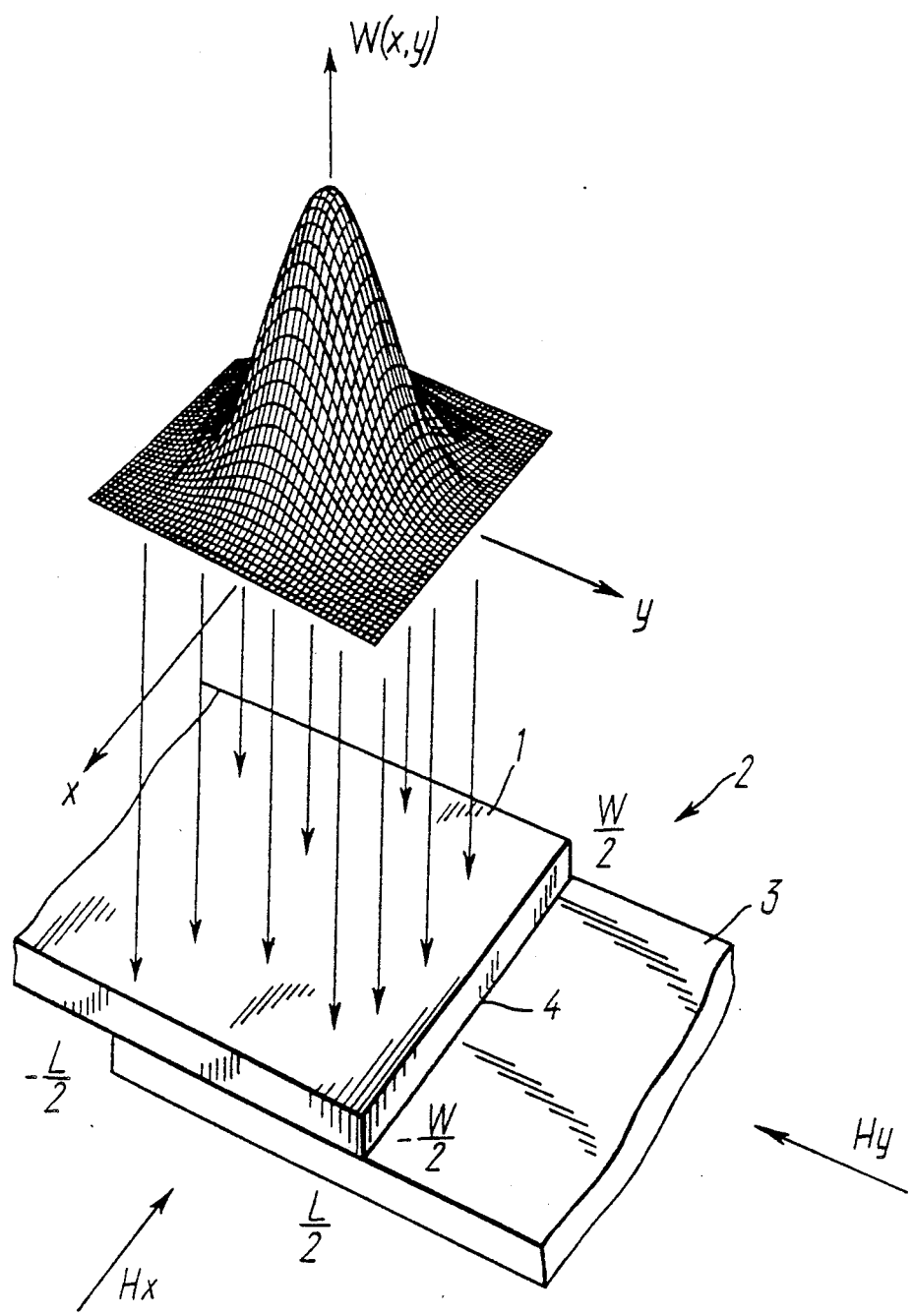
FIG. 1 shows the general view of a Josephson junction and impingement of electromagnetic radiation with an even parity two-dimensional distribution of the radiation intensity onto the entire superconducting electrode of this junction, according to the invention.

The design configuration of a device using the method of this invention for the case of even parity intensity distribution $W(x,y)$ measurements with a spatial resolution of $\Delta L \simeq 20 \mu m$ is schematically shown in FIG. 1. The radiation under study impinges on the entire surface of the upper Pb electrode 1 of the Josephson tunnel Pb-PbO-Pb junction 2 comprising a second Pb electrode 3 and barrier 4 positioned between electrodes 1, 3. The quasi-particle diffusion length $L_D$ in a Pb electrode is 6 $\mu m$, this being shorter than specified spatial resolution $\Delta L = 20 \mu m$. Josephson junction 2 with dimensions L, $W \sim \lambda_J$ features a critical current of $$I_c = j_c \lambda_J^2 = h/2e\mu_o d^2 \simeq 3nA, \quad (5)$$

where $\mu_o$ is the permeance of vacuum and e is the electron charge (h is Planck's constant and d is the depth of magnetic field penetration into a Josephson junction, as cited herein above). Measurement of $I_c(H)$ in junctions with such a critical current is described in Josephson Junctions" in the paper by R. C. Dynes and T. A. Fulton entitled "Superconducting Density Distribution in Josephson Junctions "; (Phys. Rev. B., vol. 3 No. 9 (1971), pp. 3015-3023), wherein $I_c(H)$ measurements are shown to be feasible at magnetic field intensities from zero to at least 8 $G_s$, the latter value corresponding to a magnitude of $k_{max}$ of the spatial frequency of Josephson current density as a function of the coordinates:

$$k_{max} = \frac{dH}{\phi_o} \approx 5.10^2 \text{ cm}^{-1},$$

this allowing a spatial resolution of $$\Delta L = \frac{1}{k_{max}} = 20 \text{ } \mu m,$$

i.e. the resolution specified. Consequently varying the spatial frequencies of the current structure with a stationary Josephson effect by varying the magnetic field in the range from zero to a magnitude corresponding to the reciprocal of the desired resolution, in the present case—20 $\mu$m, is feasible. The value of $I_c$ at 8 Gs is 100 $\mu$A, and since the noise current is 1 $\mu$A, measurements of maximal Josephson current variations $\Delta I_c$ of about 0.1 $I_c$ are possible with an accuracy better than 10%. The measured $\Delta I_c(k_x,k_y)$ relation is then submitted to inverse Fourier transformation in accordance with equation (4), this producing the sought-for intensity distribution $W(x,y)$. The above estimate indicates the feasibility of $\Delta I_c(k_x,k_y)$ measurements in the range of spatial frequencies from zero to $5.10^2$ cm$^{-1}$ at a signal/-noise ratio not worse than 10. The results of the reference herein above cited indicate the possibility of even better resolution. Since the magnitude of local maxima of $I_c(H)$ is inversely proportional to the magnetic field intensity H, variations $I_c(H)$, constituting 0.1 $I_c(H)$, will equal the noise current $I_N=2$ $\mu$A only at a magnetic field of about 100 Gs, this corresponding to a maximum spatial frequency $k_{max}$ of approximately $5.10^3$ cm$^{-1}$ at a corresponding spatial resolution of 2 $\mu$m.

Spatial distributions of radiation intensity can also be measured by irradiating part of the surface of one of the electrodes 1,3 (not shown in the Figure) or part of the barrier 4 surface (FIG. 2) of Josephson junction 2, using mask 5. To this end, for instance, Josephson junctions described by T. Kawakami, H. Takayanagi, "Single-crystal InAs coupled Josephson Junctions" (Appl. Phys. Lett., vol. 46 No. 1 (1985), pp. 92-94) can be used.

Figure 2:
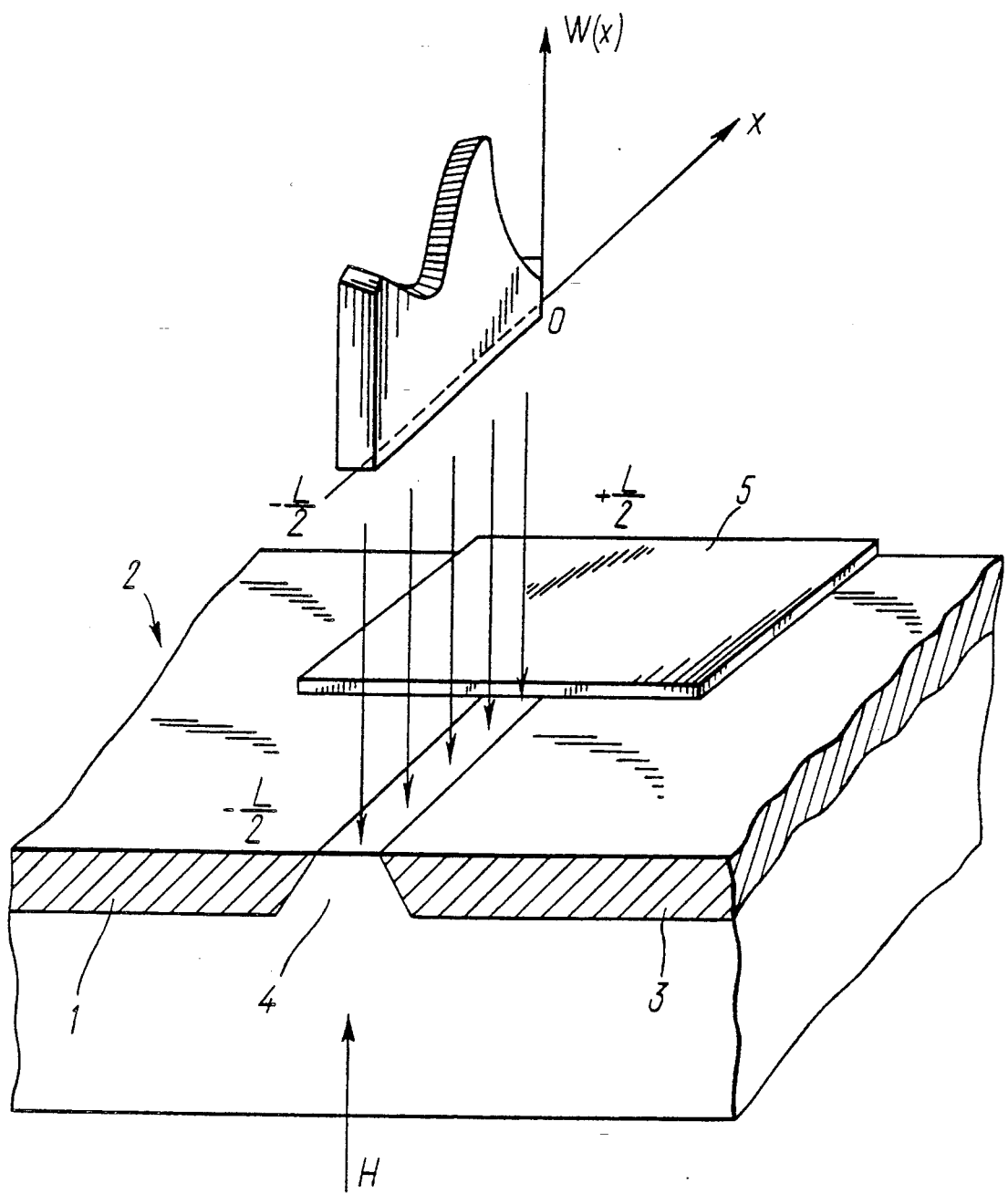
FIG. 2 shows the junction of FIG. 1, at an arbitrary unidimensional distribution of the electromagnetic radiation intensity, with this radiation impinging on a part of the Josephson junction barrier, according to the invention.

FIG. 2 illustrates an embodiment for measuring unidimensional longitudinal intensity distributions $W(x)$ $(-L/2 \leq r \leq 0)$, wherein radiation impinges on semiconductor barrier 4 causes changes in carrier concentration $n(x)$ in the barrier, this leading to variation of critical current density $j_c(x)$. The size of nonuniformities induced by irradiation in barrier 4 is a function of the carrier spreading length in the semiconductor and does not exceed 10 $\mu$m. Variations of the critical current as a function of the applied magnetic field, $I_c(H)$, are measured by varying the magnetic field H and the inverse integral Fourier transform is then used to restore the sought-for intensity distribution $W(x)$ at $(-L/2 \leq x \leq 0)$, using equation (4). Uniquiness of this restoration is ensured by irradiating only half of barrier 4.

Mask 5 can be used to direct the radiation under study to a part of the surface of one of the superconducting electrodes (not shown in the drawing), and also, without using mask 5, to irradiate the entire surface of barrier 4 (not shown in the drawing).

An embodiment of this method of measuring unidimensional symmetrical spatial distributions of radiation intensity is shown in FIG. 3, wherein the device comprises modulator 6 and Josephson junction 2 positioned along the path of the radiation with the unidimensional spatial intensity distribution $W(x)$ to be determined. Junction 2 is electrically connected to current source 7 and voltage amplifier 8. Resistor 9 in the current setting network is connected to the input of voltage amplifier 10, the output whereof drives holding sampler 11. The output of voltage amplifier 8 is connected to the input of pulse generator 12 with the output thereof driving a second holding sampler 11. The output of holding sampler 11 is connected to an input of synchronous detector 13, the other input whereof is connected to an output of power supply 14. Another output of power supply=14 is connected to electric motor 15 in modulator 6. The output of synchronous detector 13 is connected to the input of analogue-to-digital converter 16, the output whereof is connected to the input of digital interface 17 with the input/output thereof connected to computer 18 and with the output thereof connected to digital-to-analogue converter 19. The output of converter 19 is connected to solenoid 21 housed along with Josephson junction 2 inside a cryostat (not shown in the drawing).

The maximal Josephson current recorder comprises current source 7, voltage amplifier 8, resistor 9, voltage amplifier 10, holding sampler 11, and pulse generator 12, and is described in detail in R. W. Simon, P. Landmeier, "Self-Contained Automatic Recorder of the DC Josephson Current" (Rev. Sci. Instr., vol. 49 No. 12 (1978)).

The method for measuring the spatial distribution of electromagnetic radiation intensity of this invention is implemented in the herein above described embodiment as follows. First, the spatial distribution of the electromagnetic radiation intensity is coding converted into an electric signal and in this end the electromagnetic radiation is directed at Josephson junction 2 via modulator 6; junction 2 is under the action of magnetic field $H_1$ of solenoid 21. The current through junction, 2, $I_o$, with an amplitude exceeding the critical current $I_c$ of junction 2, is set with the aid of current source 7. A voltage jump is generated across junction 2 at a current $I_c$ exceeding the critical current $I_c$; this voltage jump is amplified by amplifier 8 and passed to pulse generator 12, the output signal whereof triggers holding sampler 11 to sample the output voltage of voltage amplifier 10. This output voltage, $V(t)$, is proportional to the magnitudes of critical current $I_c(t)$ of Josephson junction 2. $I_c(t)$ is modulated with a frequency equal to the rotation rate of modulator 6, and this modulation is detected by synchronous detector 13, the output signal whereof is consequently proportional to variations of the maximum Josephson current, $\Delta I_c$, and is passed via analogue-to-digital converter 16 and interface 17 to computer 18.

During coding conversion, its parameters are varied by varying the magnetic field affecting junction 2; spatial frequencies of the Josephson current density as a function of Josephson junction 2 coordinates are the coding conversion parameters in question. After measurement of $I_c$ at a magnetic field $H_1$ computer 18 commands current amplifier 20 via interface 17 and digital-to-analogue converter 19 to set a current through solenoid 21 corresponding to a new magnetic field $H_2$. The critical current variation ($\Delta I_c$) is then recorded at this new magnetic field, and this process is repeated for all values of the magnetic field, from zero to $H_{max}$, till the spatial frequency does not exceed a value reciprocal to the resolution specified (refer to equation (1)).

Decoding injective mapping of the maximal Josephson current induced by the electromagnetic radiation under study as a function of spatial frequencies k is performed by computer 18, running the integral Fourier transform of equation (4).

The use of a new effect—the stationary Josephson effect—for coding conversion into an electric signal eliminates the need for optical coding with inherent optical coding parameters variation. This substantially simplifies the measurement technique, because optical coding usually involves mechanically interchanged optical masks. The method of this invention utilizes only photoelectric and magnetic effects in a solid state structure (josephson junction) and does not involve any optico-mechanical processes.

The resolution of the method of this invention is determined by the characteristic lengths of Josephson current modulation by a magnetic field and by the characteristic lengths of photoelectric processes in superconducting electrodes or in the barrier of a Josephson junction. These characteristic lengths are in no way related to the geometry and can be made as small as required, this including even shorter that the radiation wavelength. Thus, for instance, spatial modulation of the Josephson current with a period $\Delta L \simeq 10$ μm requires a magnetic field of but $(\phi_o/d\Delta L) - 20$ Gs, which is easily realizable. The characteristic lengths of photoelectric effects in superconducting electrodes are of the magnitude of quasi-particles diffusion length $L_D$, as given by the equation:

$$L_D = (V_F l \tau_R/3)^{\frac{1}{2}}, \quad (6)$$

where l is the path of free travel and $\tau_R$ is the effective quasi-particle recombination time. At usual values of $V_F \simeq 10^8$ cm/s, $l \simeq 10^{-6}$ cm and $\tau_R \simeq 10^{-8}$s, the estimated diffusion length $L_D \simeq 6$ μm. Thermal conductivity lengths $\eta$ in film superconducting electrodes locally heated by electromagnetic radiation can also be made extremely short (units of micrometers). Characteristic lengths of carrier spreading can also be made less than approximately 10 μm in carrier generation in the barrier, e.g. of a semiconductor, induced by the radiation under study. Consequently, the characteristic lengths of Josephson current modulation and of photoelectric effects in Josephson junctions may be very short (below 10 μm), this ensuring the improved resolution of the method of this invention.

When the radiation impinges on the surface of one of the junction electrodes, the method of the invention is applicable in the longwave range as well. This is due, firstly, to the absence of diffraction restrictions to the wavelength in the method of the invention, and, secondly, to the superconducting electrodes, according to the invention, being photoreceivers for radiation with frequencies $\nu = 2\Delta/h$. The energy gap, $2\Delta$, in superconductors corresponds to the submillimeter band and this makes the method of this invention applicable in a wider spectral range-from submillimeter waves to ultraviolet radiation.

INDUSTRIAL APPLICABILITY

The invention can be used in seientific studies in solid state physics, plasma physics, medicine, biology, laser physics, material science, electronics, metrology, image recording in various spectral bands, including the IR band, for measurements of intensity distribution across the cross-section of laser beams, in monitoring the uniformity of the optical properties of IR components, in optoelectronic data processing devices. The method is also applicable to recording the spatial distributions of particles, for instance in electron and alpha-particle beams.

I claim:

1. A method for measuring the spatial distribution of electromagnetic radiation intensity, comprising coding conversion of electromagnetic radiation intensity into an electric signal, variation of the coding conversion parameters, measuring the electric signal as a function of the coding conversion parameters, unique decoding conversion of the measured dependence of the electric signal on the coding conversion parameters, comprising coding conversion of the spatial distribution of electromagnetic radiation intensity into an electric signal is accomplished with the use of the DC Josephson effect by directing the radiation directly to Josephson junction (2) having a length and width not exceeding the Josephson depth of magnetic field penetration into junction (2) comprising two superconducting electrodes (1,3) and barrier (4) positioned therebetween, using as the electric signal the variation of the maximum Josephson current in Josephson junction (2) caused by the electromagnetic radiation using the spatial frequencies in the dependence of Josephson current density on the coordinates within the plane of the Josephson junction (2) as the parameters of coding conversion and varying these spatial frequencies from zero to a value reciprocal to the specified spatial resolution by applying an external magnetic field to Josephson junction (2), and by that unique decoding conversion of the dependence of variations of maximum Josephson current in junction (2) caused by the electromagnetic radiation on the spatial frequencies is accomplished by the integral Fourier transform.

2. A method for measuring spatial intensity distributions as claimed in claim 1, wherein the electromagnetic radiation with an arbitrary spatial distribution of intensity is directed at a part of the surface of barrier (4) in Josephson junction (2).

3. A method for measuring the spatial distribution of intensity as claimed in claim 1, wherein the electromagnetic radiation with an arbitrary spatial distribution of intensity is directed at a part of the surface of one of the superconducting electrodes (1,3) of Josephson junction (2).

4. A method for measuring the spatial intensity distribution as claimed in claim 1, wherein the electromagnetic radiation intensity with an even symmetric spatial distribution of intensity is directed to the entire surface of barrier (4) in Josephson junction (2).

5. A method for measuring the spatial intensity distribution as claimed in claim 1, wherein the electromagnetic radiation intensity with an even symmetric spatial distribution of intensity is directed to the entire surface of one of the superconducting electrodes (1,3) of a Josephson junction (2).

6. A method for measuring the spatial intensity distribution as claimed in claim 1, wherein the Josephson junction (2) is a junction featuring a uniform distribution of the maximum Josephson current density in the absence of an external magnetic field.

* * * * *